(12) United States Patent
Niggemeier et al.

(10) Patent No.: US 7,613,866 B2
(45) Date of Patent: Nov. 3, 2009

(54) METHOD FOR CONTROLLING ACCESS TO A MULTIBANK MEMORY

(75) Inventors: Tim Niggemeier, Laatzen (DE); Thomas Brune, Hannover (DE)

(73) Assignee: Thomson Licensing, Boulogne Billancourt (FR)

( * ) Notice: Subject to any disclaimer, the term of this patent is extended or adjusted under 35 U.S.C. 154(b) by 173 days.

(21) Appl. No.: 10/915,067

(22) Filed: Aug. 10, 2004

(65) Prior Publication Data

US 2005/0050259 A1    Mar. 3, 2005

(30) Foreign Application Priority Data

Sep. 2, 2003  (EP)  .................................. 03019948

(51) Int. Cl.
*G06F 12/00* (2006.01)
*G06F 12/06* (2006.01)

(52) U.S. Cl. ........................ 711/5; 711/150; 711/151; 711/157; 711/168; 711/105; 711/100; 711/102; 711/103; 365/230.01; 365/230.03

(58) Field of Classification Search ................ 711/149, 711/5, 100, 102–103, 105, 150–151, 157, 711/168, 154; 365/230.01, 230.03
See application file for complete search history.

(56) References Cited

U.S. PATENT DOCUMENTS 5,572,691 A * 11/1996 Koudmani ...................... 711/5
5,881,016 A    3/1999 Kenkare et al. ........ 365/230.03
6,343,352 B1 * 1/2002 Davis et al. .................. 711/158
6,405,293 B1 * 6/2002 Chiang et al. ................ 711/154
6,415,364 B1 * 7/2002 Bauman et al. ............. 711/155
6,507,897 B2 * 1/2003 Jeddeloh ...................... 711/154
6,732,223 B1 * 5/2004 Johnson ...................... 711/105
6,732,247 B2 * 5/2004 Berg et al. ................... 711/169
6,944,728 B2 * 9/2005 Calderon et al. ............ 711/157

FOREIGN PATENT DOCUMENTS

WO     WO00/67129     11/2000

OTHER PUBLICATIONS

Prince, B. "High Performance Memories: New architecture DRAMs and SRAMs—evolution and function." 1999, John Wiley & Sons Ltd. pp. 1-2.*
"Introduction to DSP." http://www.bores.com/courses/intro/chips/6_mem.htm as archived by http://web.archive.org on Jul. 17, 2004.*
EPO Search Report (Feb. 17, 2004) Doc. No. EP 03019948.

* cited by examiner

*Primary Examiner*—Tuan V Thai
*Assistant Examiner*—Zhou H Li
(74) *Attorney, Agent, or Firm*—Robert D. Shedd; Vincent E. Duffy; Michael A. Pugel

(57) ABSTRACT

The present invention relates to a method for scheduling and controlling access to a multibank memory having at least two banks, and to an apparatus for reading from and/or writing to recording media using such method. According to the invention, the method comprises the steps of: writing an input stream to the first bank; switching the writing of the input stream to the second bank when a read command for the first bank is received; and switching the writing of the input stream back to the first bank when a read command for the second bank is received.

10 Claims, 3 Drawing Sheets

METHOD FOR CONTROLLING ACCESS TO A MULTIBANK MEMORY

This application claims the benefit, under 35 U.S.C. § 119 of European Patent Application 03019948.3, filed Sep. 2, 2003.

FIELD OF THE INVENTION

The present invention relates to a method for scheduling and controlling access to a multibank memory, and to an apparatus for reading from and/or writing to recording media using such method.

BACKGROUND OF THE INVENTION

In the following the invention is explained with reference to synchronous dynamical random access memory (SDRAM). However, the invention is applicable to any kind of dynamical random access memory, e.g. double data rate RAM (DDR-RAM), enhanced synchronous DRAM (ES-DRAM), synchronous link DRAM (SLDRAM), Rambus DRAM (RDRAM), etc. Furthermore, the invention is also applicable to single-port static random access memory (single-port SRAM).

Typical SDRAM modules comprise four independent banks. Each bank consists of rows, which consist of columns. To access a datum the corresponding row on the corresponding bank is opened by the command 'activate' for reading and writing. After activation, which needs 2 to 4 cycles, the data transfer is initiated by sending a 'read' or 'write' command together with the column address. After the transfer the bank is precharged, which again needs 2 to 4 cycles, to deactivate the open row and to prepare the bank for the next 'activate' command. The command 'precharge' closes the open row.

Typically a burst transfer is used for reading or writing several data with only one 'read' or 'write' command. The access starts at a selected location (column) and continues for a programmed number of locations. After initiating a new burst, the command bus is free and can be used to activate or precharge other banks.

In general, SDRAM is used for simultaneously storing CPU-instructions as well as data. The SDRAM is accessed through a cache. A linear access is achieved in the following way: first bank first row, second bank first row, third bank first row, fourth bank first row, first bank second row and so on. Assuming a linear access this allows to hide latency by activating the row on the next bank before the CPU/cache actually wants to access this row.

In an apparatus for reading from and/or writing to recording media, e.g. optical recording media such as digital versatile disks (DVD), a single SDRAM module is favorably used for storing instructions and data for an on-chip-CPU and for buffering the real-time data stream between a drive for the recording media and a host. In this case, to meet CPU latency constraints, the burst length of the buffer input and output stream need to be reduced to only a few beats. However, even using four beat bursts cannot nearly fulfill timing and throughput constraints, because the overhead caused by the four interfaces, i.e. CPU-instructions, CPU-data, input stream, and output stream, acts like random access. In particular, read and write access to the buffer is in random order. Therefore, since the next row is unknown, pre-activation of buffer banks is not possible.

To circumvent this problem and to eliminate latency caused by the 'activate' and 'precharge' commands, the SDRAM module can be replaced by static RAM (SRAM). Alternatively, the number of modules can be increased for reducing the workload of a single module, or the width of the data bus between the module and the application specific integrated circuit (ASIC) can be expanded for increasing the bandwidth. However, additional wiring is needed for these solutions, which is usually limited by the IC design. Therefore, this solution is in general not feasible. A further solution consists in de-coupling the buffer input and output, which can be performed by large on-chip SRAM buffering two or more complete rows. However, in this case a very complex logic is required for controlling the data flow.

SUMMARY OF THE INVENTION

All of the above solutions have in common that they are very costly. It is an object of the invention to provide an alternative solution for DRAM scheduling and controlling.

According to the invention, a method for controlling access to a multibank memory having at least two banks comprises the steps of:
  writing an input stream to the first bank;
  switching the writing of the input stream to the second bank when a read command for the first bank is received; and
  switching the writing of the input stream back to the first bank when a read command for the second bank is received.

This method provides a cheap and less complex solution for memory scheduling and controlling. The data buffer is spread over at least two banks, which are linearly accessed. The first bank is filled with the input stream until a read command for this bank is received from a buffer control. In this case the input stream switches to the second bank. If the output stream needs to access the second bank the input stream returns to the first bank. The input stream does not leave its bank until the output stream wants to read the same bank.

In this way every interface works on its own bank. The next access is planed and prepared while the current access is still executed. Therefore, the row of the next access is opened and the subsequent burst is issued immediately after termination of the current burst. All latencies caused by bank activate or precharge of all interfaces are completely hidden behind burst transfers and the full bandwidth is available for data transfers. All remaining latencies are minimized to the sum of the length of the bursts in a scheduler queue, i.e. the delay after which a burst can be started depends only on the length of the bursts in the scheduler queue. If the SDRAM is idle the burst can start immediately without activation of a row because any subsequent access to the buffer occurs linear to the same row. The method is fully compatible to the ATAPI command set for accessing (read and write) optical drives and to read-ahead functionality.

Favorably, the method further comprises the steps of:
  reading an output stream from the first bank;
  switching the reading of the output stream to the second bank when the end of the previously written input stream in the first bank is reached; and
  switching the reading of the output stream back to the first bank when the end of the previously written input stream in the second bank is reached.

Following a read command for the first bank the output stream starts reading the first bank. When it reaches the end of the previously written input stream in this bank, no further data are available in this bank, since the writing of the input stream has been switched to the second bank upon receipt of the read command. Therefore, the output stream needs to switch to the second bank, too, for accessing the further data.

This of course means that the writing of the input stream switches back to the first bank. When the output stream reaches the end of the previously written input stream in the second bank, it switches back to the first bank and so on.

Advantageously, the method further comprises the steps of:

upon switching the writing of the input stream from the first bank to the second bank, marking the last position of the input stream in the first bank with a first pointer; and upon switching the writing of the input stream from the second bank to the first bank, marking the last position of the input stream in the second bank with a second pointer.

To reliably switch each bank between input and output functionality a complex pointer control is required. By marking the last position of the input stream in the first or the second bank, respectively, the control of the switching process for the output stream is noticeably simplified.

In an advantageous refinement the method further comprises the steps of:

marking the size of a complete output block in a bank with a further pointer; and enabling read access to a bank only when at least a complete output block has been written to the bank.

The first bank is filled with the input stream until a previously set pointer, a block pointer, is reached. Then a signal is sent to the buffer control indicating that a complete block is available in the bank. Only now the output stream is allowed to read this bank. If upon reading from this bank the block pointer is reached, the output stops until the next block is requested. In the meantime a further block pointer is set for the second bank, to which the writing of the input stream has been switched. Providing a block pointer and monitoring if the block pointer has been reached ensures that read access to a bank is only possible when a complete output block, which is the smallest unit of the data stream that can be processed, is available.

Favorably, the multibank memory is a dynamical random access memory, e.g. an SDRAM. In this case the method according to the invention takes full advantage of the pipelining architecture of the memory.

Advantageously, the method further comprises the step of holding an activated row of a bank open until a refresh cycle is issued or until the end of the row is reached by a burst. This allows to save approximately ten cycles latency for each single access.

Favorably, the banks are single-port static random access memory modules. In this case input data are written into the first module until a read request is received for this module. The input data are then written into the second module whilst data are read from the first module. Reading and writing is, therefore, performed simultaneously. A further advantage is that instead of a more expensive and complicated dual-port SRAM module of a specific size two single-port SRAM modules with half the size each can be used, e.g. two single-port SRAM modules with 512 bytes each instead of a dual-port SRAM module with 1024 bytes.

Advantageously, more than two banks are provided for data buffering. This allows to buffer a larger amount of data. However, the overall performance is not further enhanced by this measure.

According to a further aspect of the invention, the method further comprises the steps of:

physically separating the input stream and the output stream from CPU-instructions and CPU-data; and storing the CPU-instructions and the CPU-data on at least one of the remaining banks other than the first bank and the second bank.

If the CPU-instructions and the CPU-data are physically separated, which corresponds to the so-called Harvard architecture, they can be separately stored on the two remaining banks of the four banks of a typical SDRAM. The rows on the instruction bank and the data bank can remain activated, too, to take advantage of spatial and temporal localization.

Advantageously, a device for controlling access to a multibank memory having at least two banks performs a method according to the invention.

Favorably, an apparatus for reading from and/or writing to recording media, e.g. optical recording media, uses a method or comprises a device according to the invention for controlling access to a multibank memory having at least two banks.

BRIEF DESCRIPTION OF THE DRAWINGS

For a better understanding of the invention, an exemplary embodiment is specified in the following description with reference to the figures. It is understood that the invention is not limited to this exemplary embodiment and that specified features can also expediently be combined and/or modified without departing from the scope of the present invention. In the figures.

DETAILED DESCRIPTION OF PREFERRED EMBODIMENTS

Figure 1:
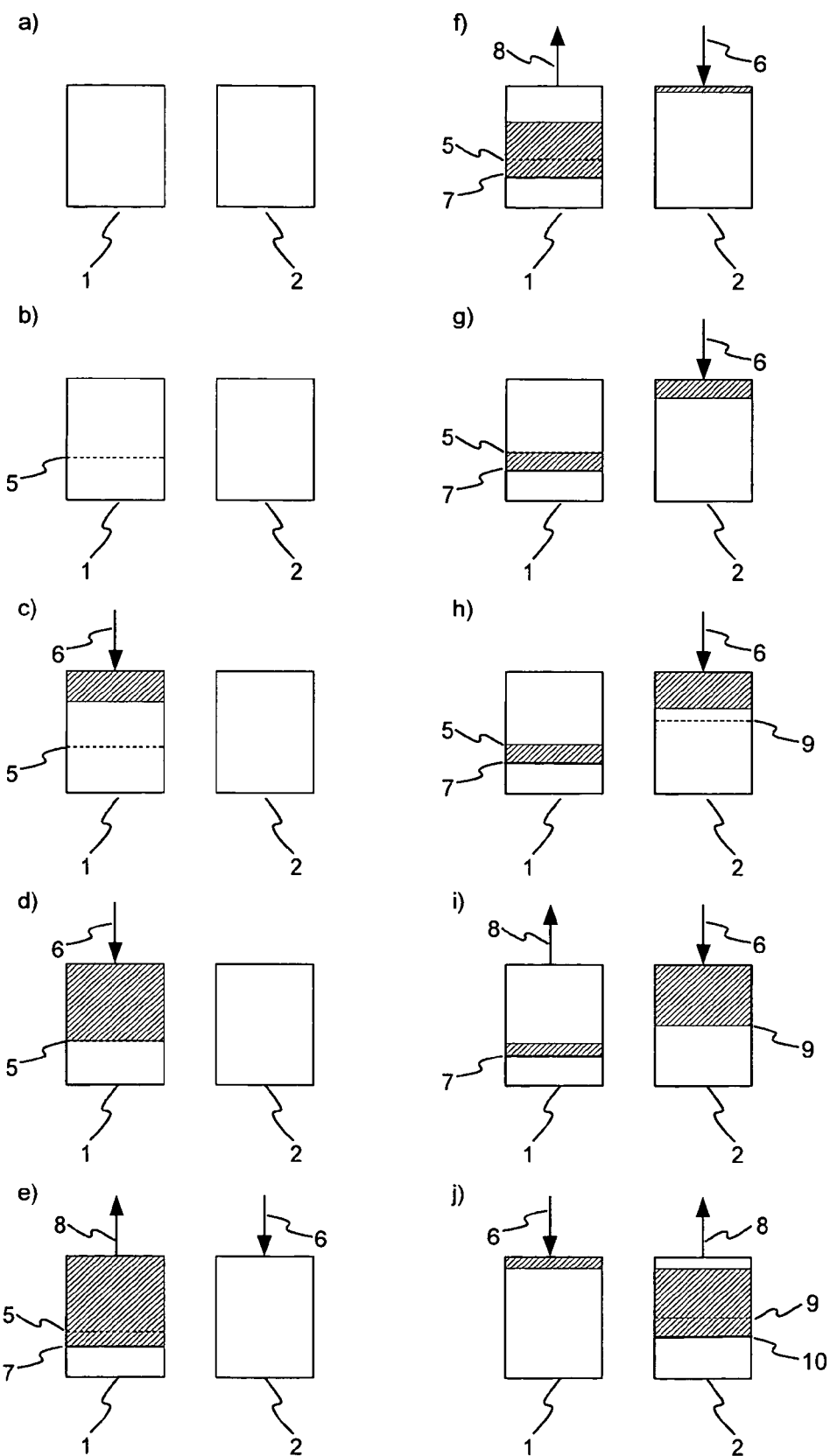
FIG. 1 shows in a sequence of states the access to two SDRAM banks using a method according to the invention.

In FIG. 1 access to two banks 1,2 of an SDRAM using a method according to the invention is shown. For simplicity the access is divided into a sequence of states of the banks, which are depicted in parts a) to j) of FIG. 1. For better clarity in the figure only a single complete output block is written into one bank 1,2. Of course a plurality of output blocks can subsequently be written into the banks. When the access is initiated both banks 1,2 are empty, which corresponds to FIG. 1a). As shown in part b), in the left bank 1 a pointer 5 is set to mark the size of an output block. The input stream 6 coming from the drive are now stored in the left bank 1, which is depicted in part c). As soon as the pointer 5 is reached, the buffer can be read. Until a read access occurs, the writing to the left bank 1 continues. This is shown in part d). In this way the first bank 1 is filled with a plurality of output blocks. After the first read access to the left bank 1 the input stream 6 is switched to the right bank 2 and its last position on the left bank 1 is marked with a further pointer 7, which is depicted in part e). As can be seen in parts f) and g), the input stream 6 and the output stream 8 are active at the same time until the complete output block size has been read from the left bank 1. In the right bank 2 a new pointer 9 is set marking the size of an output block, which is shown in part h). When this pointer 9 is reached, the left bank 1 is read until the jump point 7 is reached. This is indicated in part i). Then the right bank 2 is read forcing the input stream to switch back to the empty left bank 1. This situation, which is depicted in part j), is the same as the situation in part f), whereby left bank 1 and right bank 2 are swapped. Upon switching the last position of the input stream on the right bank 2 is marked with a further pointer 10. The access scheme can be extended to more than two banks.

In this case upon switching between the banks it is possible to choose among at least two banks for writing the input stream. By way of example, this choice can be based on the overall workload of each bank.

Figure 2:
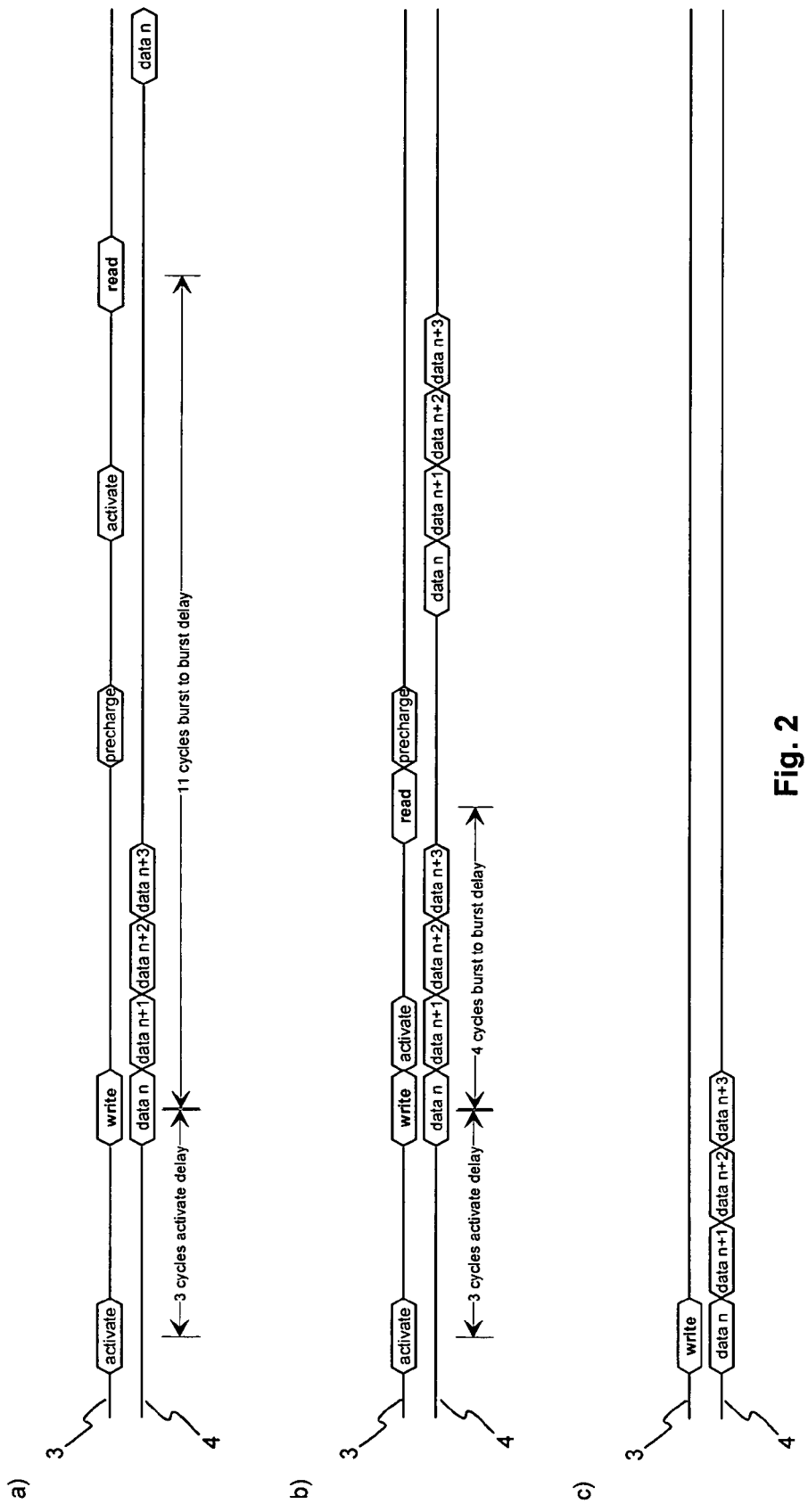
FIG. 2 shows latencies during data transfer on an SDRAM bank.

Latencies during data transfer on an SDRAM bank 1, 2 are shown in FIG. 2. The data transfer is divided into data transfer occurring on a command bus 3 and data transfer occurring on a data bus 4.

FIG. 2a) depicts a typical random read/write access to one SDRAM bank only. First a row from that bank is activated. Then a write command to that row is issued and the data transfer is initiated. After that a precharge command is given for closing the row and for precharging for the next row access. Another row on the same bank is then activated, a read command to that row is issued and data transfer starts after a delay due to the 'read' command.

An SDRAM access over more than one bank is shown in FIG. 2b). First a row from a first bank is activated. A write command to that row from the first bank is then issued and data transfer is initiated. Simultaneously a row from a second bank is activated. A read command to that row from the second bank is then given and data transfer starts after a delay due to the 'read' command. It is to be noted that a write command in this example would lead to a data transfer from the second bank directly concatenated to the data transfer of the first bank.

FIG. 2c) shows a single burst to an already opened row on the same bank. In this case a write command is each time processed without delay on that row.

Figure 3:
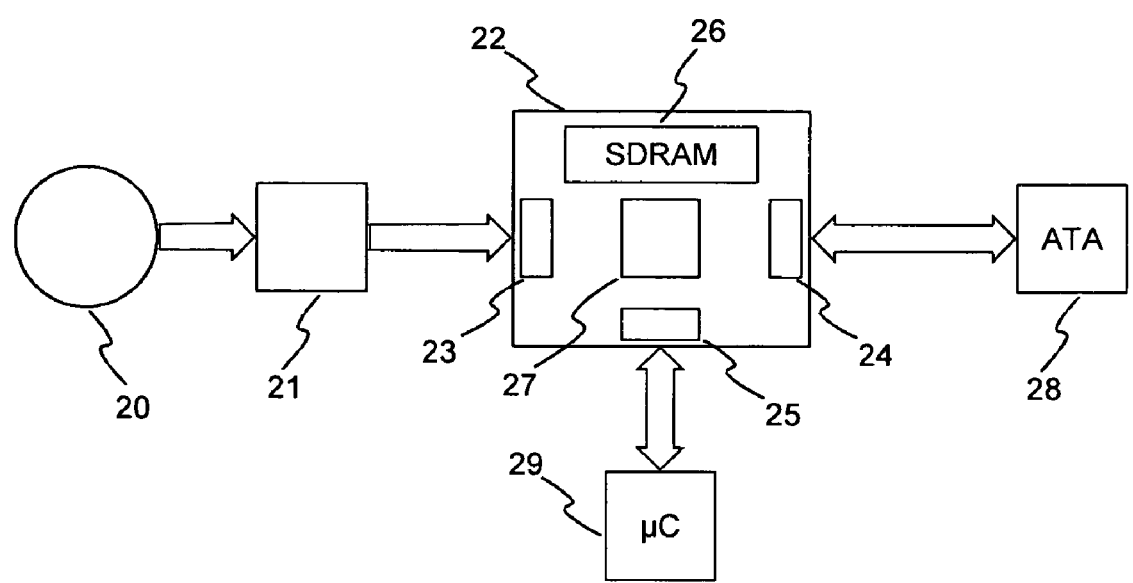
FIG. 3 shows an apparatus for reading from recording media using a method according to the invention.

In FIG. 3 an apparatus for reading from recording media 20, e.g. optical recording media, using a method according to the invention is shown. Data are read from the recording medium 20 and are pre-processed by a pre-processing block 21, e.g. for error correction. The pre-processed data are transmitted as an input stream via a first interface 23 to an integrated circuit 22, which among other functions controls the data transfer within the apparatus. Via a second interface 24 the integrated circuit 22 communicates with a data bus 28, e.g. an ATA bus. Using this data bus 28 requested data are output for further processing. A micro-controller 29 communicates with the integrated circuit 22 via a third interface 25, e.g. for controlling settings of the integrated circuit 22 or for requesting specific data. The integrated circuit comprises an internal buffer 26 comprising a plurality of SDRAM banks 1, 2 for buffering all incoming data. The data traffic is controlled by a scheduler 27, which performs the method described with reference to FIG. 1 for handling the buffer accesses. In the figure, the input stream and the output stream are physically separated from instructions from the micro-controller 29 and micro-controller data.

What is claimed is:

1. Method for accessing a multibank memory having at least two banks into which an input stream consisting of data blocks is written, including the steps of:
   writing the input stream to the first bank;
   marking the size of a complete output block in the first bank with a first pointer;
   initiating a read access to the first bank during the writing of the input stream to the first bank;
   enabling read access to the first bank only when at least a complete output block has been written to the first bank;
   switching the writing of the input stream to the second bank in response to the enabled read access to the first bank irrespective if the data block of the input stream currently written to the first bank has been completely written to the first bank;
   marking the last position of the input stream in the first bank with a second pointer;
   marking the size of a complete output block in the second bank with a third pointer;
   initiating a read access to a second bank during the writing of the input stream to the second bank;
   enabling read access to the second bank only when the input stream has been written to the second bank up to the third pointer; and
   switching the writing of the input stream back to the first bank in response to the read access to the second bank irrespective if the data block of the input stream currently written to the second bank has been completely written to the second bank.

2. Method according to claim 1, further including the steps of:
   reading an output stream from the first bank;
   switching the reading of the output stream to the second bank when the end of the previously written input stream in the first bank is reached; and
   switching the reading of the output stream back to the first bank when the end of the previously written input stream in the second bank is reached.

3. Method according to claim 1, wherein the multibank memory is a dynamical random access memory.

4. Method according to claim 1, further including the step of holding an activated row of a bank open until a refresh cycle is issued or until the end of the row is reached by a read burst.

5. Method according to claim 1, wherein the banks are single-port static random access memory modules.

6. Method according to claim 1, further including the step of providing more than two banks for data buffering.

7. Method according to claim 6, further including the steps of:
   physically separating the input stream and output stream from CPU-instructions and CPU-data; and
   storing the CPU-instructions and the CPU-data on at least one of the remaining banks other than the first bank and the second bank.

8. Device for controlling access to a multibank memory having at least two banks wherein it is adapted to perform a method according to claim 1.

9. Apparatus for reading from and/or writing to recording media, wherein it is adapted to use a method according to claim 1 for accessing a multibank memory having at least two banks.

10. Apparatus for reading from and/or writing to recording media, wherein it is adapted to use a device according to claim 8 for accessing a multibank memory having at least two banks.

* * * * *